(12) United States Patent
Yamanoi et al.

(10) Patent No.: US 6,269,058 B1
(45) Date of Patent: Jul. 31, 2001

(54) WIDE CAPTURE RANGE CIRCUITRY

(75) Inventors: Koyu Yamanoi, Funabashi; Hiroshi Kobayashi, Kawasaki; Futoshi Fujinara, Kanagawa, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/225,125

(22) Filed: Jan. 4, 1999

(51) Int. Cl.[7] ........................................ G11B 7/00
(52) U.S. Cl. ................... 369/47.28; 369/47.48; 369/59.1; 360/51
(58) Field of Search ................ 369/47.1, 47.11, 369/47.15, 47.28, 47.29, 47.3, 47.36, 47.48, 53.1, 53.34, 59.1, 59.12, 60.01; 360/33.1, 36.1, 37.1, 39, 42, 51, 69, 73.01

(56) References Cited

U.S. PATENT DOCUMENTS

| | | | |
|---|---|---|---|
| 5,070,492 | * 12/1991 | Ogawa et al. | 369/47.28 |
| 5,457,581 | * 10/1995 | Hallamasek | 360/51 |
| 5,565,752 | * 10/1996 | Nagasawa et al. | 360/77.16 |

* cited by examiner

*Primary Examiner*—Muhammad Edun
(74) *Attorney, Agent, or Firm*—W. Daniel Swayze, Jr.; W. James Brady; Frederick J. Telecky, Jr.

(57) ABSTRACT

Circuitry and method for synchronizing operating speeds of signal processing devices to the data rate of a signal. It applies in particular to Compact Disk (CD) and Digital Versatile Disk (DVD) drives to be used with portable devices. The circuitry does not require clock synchronization speeds in excess of the instantaneous data rate used by the disk drive and also reduces power consumption.

32 Claims, 6 Drawing Sheets

| Functional Components | Description of the functional component |
|---|---|
| Count6b | 6-bit ECL counter to count maximum number of TBGVCO clock that an incoming signal stayed in a level. |
| Zerodetc | Detect the sync pattern (11T/11T for CD ROM and 14T for DVD ROM) and issue a reset signal to the other CTB block once the current CTB block counter counts reached 2. |
| Tmaxreg | Store the 6-bit ECL counter value of the TBGVCO clock just before the data change level. |
| Comp6 | Compare 6-bit data from 2 Tmaxreg (TRD & TRA) and update TRA from TRD if TRD > TRA. |
| Winddec01 | Select the duration where sync pattern is to be detected. |
| Ctrl5b | 16-bit counter to counts TBGVCO and DSVCO clock frequency. |
| Tmaxldac | 12T Current output proportional to the Tmax value. |
| CMSW3 | 3T Current output proportional to UDCT counter. |
| Udctr5c | Up/Down counter to increase or decrease the DSVCO clock frequency during Fine Adjust phase. |
| Syncdetect0 | Logic to check whether sync pattern is within period, to detect missed 5 Sync patterns, to reset the 16-bit counter to zero, to enable count up or count down clock to UDCT. |

| Name | Direction | Description |
|---|---|---|
| Rdla/Rdlab | Input | CML received data input |
| Vrefs | Input | Voltage reference of 2.06 volts |
| En | Input | Active high enable signal |
| Syncdet | Input | Sync pattern detect selected from register bit (PDCR[5]) |
| Syncen | Input | Sync pattern enable signal controlled from input pads |
| Tbgvco/Tbgvcob | Input | CML Time Base Generator VCO clock input (for example 80Mhz) used to counts the maximum number of Tmax value within sync pattern. |
| Dsvco/Dsvcob | Input | CML Data Synchronizer VCO clock input used in Fine Adjustment phase |
| Cdmode | Input | Select '1' for CD ROM mode and '0' for DVD ROM mode |
| Autopdb | Input | Auto power down the circuit after sync pattern is detected (when Phden bit is set). |
| Windw[1:0] | Input | 2 bits to select window accuracy of 1, 2, 3 and 10 % that sync pattern should be detected. It is controlled by SYCR[2:1] bit. |
| Defect | Input | Active high to indicate defect input and counter is resetted to zero |
| Rdl/Rdlb | Output | CML data of Rdla/Rdlab in RZ format |
| Rd2/Rd2b | Output | CML data of Rdla/Rdlab in RZ format |
| Phden | Output | Phase detector enable signal to indicate phase 2 of Fine Adjustment phase is completed |
| Outof5 | Output | Missed 5 sync pulse detected |
| Sycwd | Output | Sync pattern window time frame period signal |
| DSDIV[1:0] | Input | VCO frequency divider is selected. |
| DSCPI | Input | Input current for Data synchronizer charge pump |
| DSVCOI | Input | Input current for Data synchronizer VCO |
| IDSCP | Output | Scaled output current to Data synchronizer charge pump |
| IDSVCO | Output | Scaled output current to Data synchronizer VCO |

WIDE CAPTURE RANGE CIRCUITRY

FIELD OF THE INVENTION

The present invention relates to circuitry having a wide capture range (bandwidth), particularly suitable for use with high-speed drives. Specific examples include drives using either Constant Linear Velocity (CLV) modulation or Constant Angular Velocity (CAV) modulation, or both.

BACKGROUND

There is a need for the normal playback speed of disk drives, in particular, Compact Disk (CD) or Digital Versatile Disk (DVD) drives, to be readily upgraded for use with faster disk drives. There are two types of modulation used to read to or write data from a disk: Constant Linear Velocity (CLV) modulation and Constant Angular Velocity (CAV) modulation.

CLV provides a way of reading and writing data to disk that uses a single track in a continuous spiral from the center of the disk to the circumference, instead of several concentric circles as with CAV modulation. Each sector of a CLV disk is the same physical size and the disk drive continuously varies the rate at which the disk spins so that as the read/write head moves from the center of the disk, the disk slows down. In other words, the disk rotation speed necessarily varies with the radius of the disk so that the read data rate can be held constant. The faster that the disk is able to spin, the shorter the access times needed since the rate of change is a rate dependent on a faster overall rotating speed. Since the CLV disks have retained the same diameter for the sake of uniformity, increasing the overall speed of rotation means that the data on the data-efficient CLV modulated disks will need to be accessed in correspondingly shorter times and the read rate adjusted to be correspondingly faster. CLV also provides for more data storage on the disk than drives using CAV modulation.

CAV causes the disk to rotate at a constant speed, with the number of bits in each concentric track being the same. Because the inner tracks are smaller in diameter than the outer tracks, the density on the outer tracks is less than optimum. Thus the problem of data access is not as critical with the less data-efficient CAV disks as compared to CLV. The CAV disk does permit fast data retrieval and is well suited to storing high-resolution photos or video. The CAV disk can be designed to operate with an access time suited to the most critical inner track where data density is the greatest with no concern for holding the read rate constant as with the variable rotation speeds of CLV disks. However, as drive rotation speeds increase, even the access times for reading data on the inner tracks of the CAV disks will become a critical design parameter. For example, when the track jump commands enable the actuator to move from inner tracks to outer tracks, the actuator moves faster than the disk rotation speed and the read rate changes as a function of radius thus engendering a requirement for faster access and seek times to accommodate this change.

The codes used to program the disk drives (either CD or DVD) are "DC-Free" codes, i.e.; the long-term average duty cycle is 50%. CDs use an eight-to-fourteen bit code termed EFM while DVDs use an eight-to-sixteen bit code termed EFM Plus. The EFM system maps eight user bits into fourteen channel bits, while using only a subset of all possible 14-bit words. The EFM Plus system maps eight user bits into 16 channel bits while using a subset of all possible 16-bit words.

For CD drives, only the words that satisfy the run length constraints of no fewer than three channel bits and no more than 11 channel bits between transitions are used. The code is called the (2,10) Run Length Limited code. This yields a minimum of two zeroes between the marks and a maximum of ten zeroes between the marks. As an example, 100100 is written as 3T/3T and yields the maximum frequency while 10000000000010000000000 is written as 11T/11T and yields the minimum frequency. The encoder appends three additional channel bits (to the maximum of 11) for charge control. This forces the duty cycle to 50%. The short sector in the CD Read-Only-Memory (ROM) drive consists of 588 channel code bits and has only one synchronization pattern: 11T/11T. There is one synchronization pattern in every sector (588T) and it is not treated as normal data. The data rate of incoming data can be determined by calculating the duration of this incoming 11T/11T-synchronization pattern. The 11T pattern is the longest signal pattern for a CD drive but there can be no 11T/11T combination in the data stream for a conventional CD-ROM's drive.

For DVD drives, only words that satisfy the run length constraints of no fewer that 3 channel bits, and no more than 11 channel bits, between transitions are used, i.e., the same (2,10) Run Length Limited code as for the CD drives. However, there are four states of the conversion table and each state is selected by a DC component suppress control (DCSC) algorithm, permitting the suppression of the DC component of each. The short sector in the DVD-ROM drive consists of 1488 channel code bits with only one synchronization pattern: 14T/4T. There is one synchronization pattern in every sector (1488T) and it is not treated as normal data. The data rate of incoming data can be determined by calculating the duration of this incoming 14T-synchronization pattern. The 14T pattern is the longest signal pattern for a DVD's drive but there can be no 14T/4T combination in the data stream (the EFM Plus Modulation rule identifies it as violated code) for a DVD-ROM's drive. The present invention provides a solution by significantly increasing the PLL's (or PLL equivalent's) capture range.

DVD-ROM drives use a Non-Return-to-Zero (NRZ) format. In EFM Plus code, the signals are inverted at the center of each "1" in the data stream.

Conventional systems use the following process to increase the capture range of the PLL (thus reducing seek/access time):

a. The synchronization pattern is detected as the $T_{max}$ pattern and the clock's counter is set to count at least twice the rate of the channel code at the maximum disk speed associated with the VCO synchronization clock of the PLL.

b. Upon detection of the $T_{max}$ pattern, the counter data is transferred to a microprocessor and the data read/write speed is calculated.

c. The calculated speed is reloaded to the VCO synchronization clock and the $T_{max}$ pattern is compared to the read/write data rate.

d. If the VCO's frequency is not synchronized with the read/write data rate, a "kick pulse" is generated by the microprocessor to adjust the frequency of the VCO.

Conventional technology has required the $T_{max}$ pattern detection to occur at a clock rate of two to four times the read/write data rate. Assuming the clock's counter has a 2X-pattern detection rate, the count value variation would be 28±2 (maximum) for the 14T DVD's drive. Further, the VCO synchronization clock would be programmed to ½ the clock counter's frequency. The capture range when in the phase detection mode of the PLL requires ±7% variation about the VCO's center frequency to accommodate variations in frequency due to the process itself, power supply voltage fluctuations, and temperature, among others. Because this assures the need for a kick pulse (the VCO's center frequency is continuously being adjusted) more power is dissipated because of the microprocessor's contribution to the adjustment and the need for continuous adjustment. When the conventional system is called on to perform this adjustment over very short time intervals, such as those associated with the new higher disk rotation speeds, it encounters physical limits to processing times. Therefore, there is a need for overcoming this limitation with a basic design change.

SUMMARY

The preferred embodiment of the present invention's wide capture PLL (or PLL equivalent) has two modes: frequency detection mode and phase detection mode. The frequency detection mode consists of three steps:

a. $T_{max}$ Detection. The Time Base Generator (TBG) VCO's clock is used to find the longest mark and the TBGVCO's clock frequency is used for any frequencies higher than the target read/write data rate. The longest mark is the synchronization mark. In DVD drives, the 14T pattern is used as the synchronization mark. This 14T pattern is the "violated code" of EFM Plus that occurs every 1488 bits in the short frame length. The $T_{max}$ window is opened approximately six to ten times during the short frame length. The maximum count value encountered during this period is stored in the $T_{max}$ register.

b. In the synchronization detection step, the data synchronizer voltage controlled oscillator (DSVCO) and the TBGVCO's frequency are the same, with the TBGVCO locked to the DSVCO. During the synchronization step, the DSVCO's frequency is changed to the proportional frequency, i.e., $14/T_{max}$. Unlike conventional systems using PLLs, the proportional frequency is generated by a current divided from the TBGVCO to the DSVCO's center frequency.

c. In the fine adjustment step, once the center frequency of the DSVCO is set, the reference clock is set to the data synchronizer's output in order to detect the appropriate synchronization pattern (14T/4T for DVD or 11T/11T for CD). Using the detection window and an up/down counter sets the DSVCO's frequency. The detection window identifies the next estimated synchronization pattern period (e.g., 1488T in a DVD-ROM's driver) and the up/down counter is used to fine adjust the DSVCO's frequency.

When the synchronization pattern is detected in the detection window, the PLL moves to a conventional phase detection mode.

Some of the salient advantages of the present invention are that it provides:

lower data rates by using a current divider to the DSVCO.

clock speeds no higher than the data read/write rate for the disk drive.

a near capture-free Phase-Locked Loop (PLL) for a high-speed drive, in particular either CD or DVD drives.

very fast seek time for reading from or writing to a data storage component.

a very fast access time for reading from or writing to a data storage component.

a more efficient method requiring less energy to implement.

a time base generator (TBG) during wide capture operation.

a synchronization detection "power down" mode to the entire circuit.

an automatic power down enabled through a register control bit.

detect output monitor pins synchronized through register control bits window detection accuracy synchronized through a register control bit.

a $T_{max}$ counter read-only register for capturing the highest count.

an up/down counter read-only register for capturing the count used in current scaling.

a detect signal input to reset the data rate detection.

two methods of current scaling, one for a wide capture range step and one for a fine adjustment step.

application to any system using a PLL circuit. a capability of working without using a time base generator (TBG) PLL.

DETAILED DESCRIPTION OF THE PREFERRED EMBODIMENTS

A salient feature of the current invention is the provision of synchronization to high speed devices without requiring the synchronization clock to operate at speeds higher than the device's own input operating speed. The preferred embodiment of the present invention provides a system and method for matching the data synchronization clock speed to that of representative higher state-of-the-art disk drive speeds, in particular CD or DVD drives.

Figure 1:
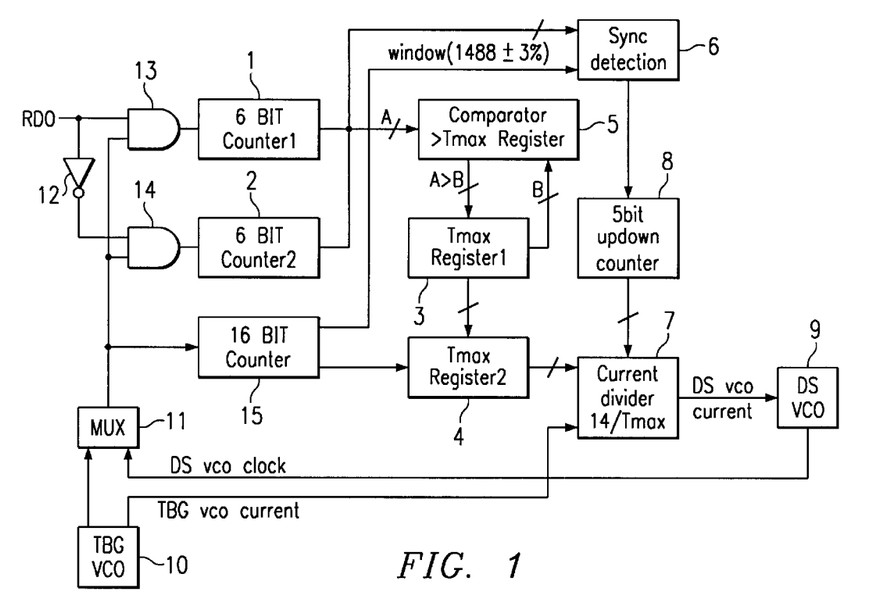
FIG. 1 depicts the synchronization pattern detection operation.
Figure 2:
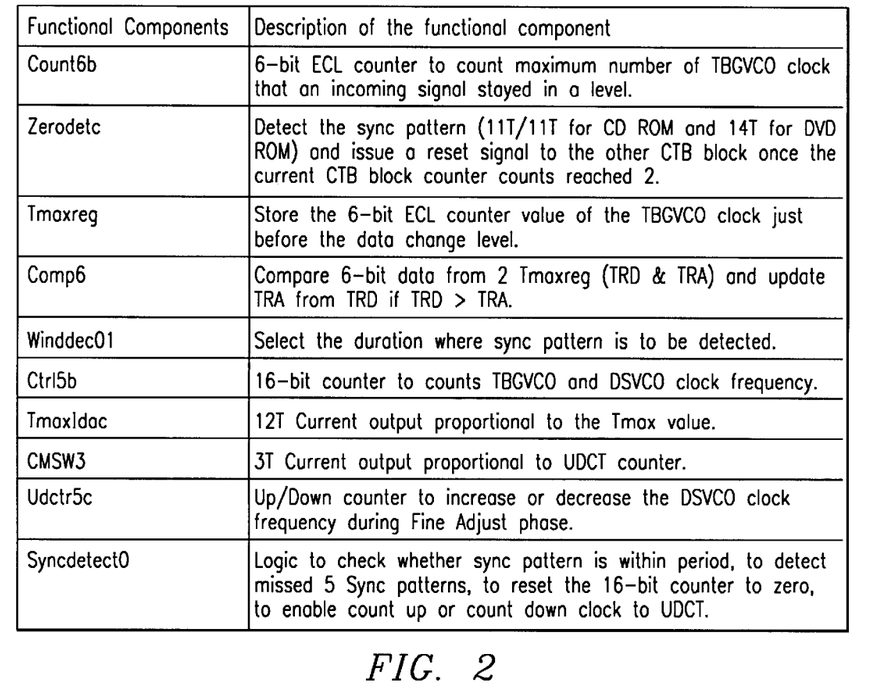
FIG. 2 provides a Sync7 interface description.

A simplified block diagram description of the synchronization detection circuit (for a DVD) of the present invention is shown in FIG. 1. There are two $T_{max}$ counters 1 and 2, two Tmax registers 3 and 4, a $T_{max}$ value comparator 5, a synchronization pattern detection circuit 6, a current divider circuit 7, an up/down counter 8, a data synchronization VCO 9, a TBG VCO 10, a multiplexer 11, an inverter 12, two gates 13 and 14, and a 16-bit counter 15. Certain of these components, for example, the registers, serve functions at different stages of operation and thus can be considered to be common components of separate circuits. This saves the designer both in space on the chip and in power consumption.

The frequency synthesizer PLL (used as a time base generator (TBG) in this example) generates a fixed frequency for counting the synchronization pattern. The counter counts the number of TBG clock periods of the data in either high or low (inverted) state, stores the highest count and automatically adjusts the VCO's frequency to the rate of the incoming data stream by scaling down the current to the DSVCO. The DSVCO frequency is calculated from the relationship:

$$F=(x/N)F(TBGVCO) \quad (1)$$

Where:

x=11 for CD drives x=14 for DVD drives

N =the maximum count stored in the $T_{max}$ register.

The first step of the frequency detection mode is termed $T_{max}$ detection step (step A).

In the wide capture step (step B) of the frequency detection mode, the incoming data (Rd 1 a and Rd 1 b in FIG. 3) are ANDed together with the TBGVCO's frequency (e.g., 80 MHz) and fed to CTA 1, the first Current Mode Logic (CML) 6-bit counter clock input, Clk. CTA 1 counts the number of clock periods in the Clk input. CTB 2, a second CML 6-bit counter performs the same function as CTA 1, except that it inverts the incoming data. This results in CTA 1 counting the incoming data held at a high state and CTB 2 counting the data held at a low state. Whenever the incoming signal level changes (high to low or vice versa), the data from the counter that counted the immediately preceding level is transferred to the first register TRD 17 where it is stored before the counter is reset. TRD 17 and the second register TRA 18 are initially set to zero. The data in TRD 17 are compared to that in TRA 18. If the value in TRD 17 is smaller than the value in TRA 18, then the comparator COMP6 20 outputs nothing. However, if the value in TRA 17 is larger than that in TRA 18 then COMP6 20 outputs a "load" signal that loads the value from TRD 17 into TRA 18. The process is iterated and TRA 18 stores the highest value of input data, Rd 1 a and Rd 1 b, held in a particular level.

The fine adjustment step is defined by the switching of the clock frequency from the TBGVCO frequency to the DSVCO frequency (F). Synchronization pattern is checked for position within the window for every sector of data (1488T for DVD and 588T for CD). Accuracy is nominally held to either ±3% or ±10% of Phase Detector Enable Signal (Phden=1). If the synchronization pattern is started before the window period time frame (e.g., <1472T for a 1% accuracy window setting for a DVD drive), the DSVCO's frequency is stepped up by increasing the current to the VCO. Conversely, if the synchronization pattern is started after passing the window (e.g., >1504T for a 1% accuracy window setting for a DVD drive) the frequency of the DSVCO will be stepped down by decreasing the current to the VCO. The process is iterated until the synchronization pattern appears within the window period. Once in the window, the frequency is locked and further attempts at changing the frequency are ignored.

This largest value stored in register TRA 18 is now the synchronization pattern count since it has the longest duration (i.e., 11T for CD and 14T for DVD). When the TBGVCO's 10 count reaches 40960 for DVD (24576 for CD), the data stored in TRA 18 are loaded into register TRB 4. This 6-bit data are then read from the serial port register, $T_{max}$ R1. The approximate DSVCO's 9 PLL center frequency is calculated using the $T_{max}$ R1 value. For example, if the $T_{max}$ R1 value is 40 counts, then the data rate of incoming data is 80/(40/14)=28 Mbs. Thus the value for the current, DAC (DSVCO 9 current) 7a in FIG. 1, will be reduced to match that of the DSVCO 9 so that the DSVCO's 9 frequency is approximately 28 Mhz.

In the fine adjustment step, when the current of the DSVCO 9 PLL is adjusted to yield the appropriate center frequency, the reference clock is changed to that of the DS PLL output (DSVCO) and the detection of the synchronization pattern is now done using this clock. The clock rate approximates the actual incoming data rate. Thus CTA 1 and CTB 2 count the synchronization pattern (11T for CD and 14T for DVD).

Figure 4:
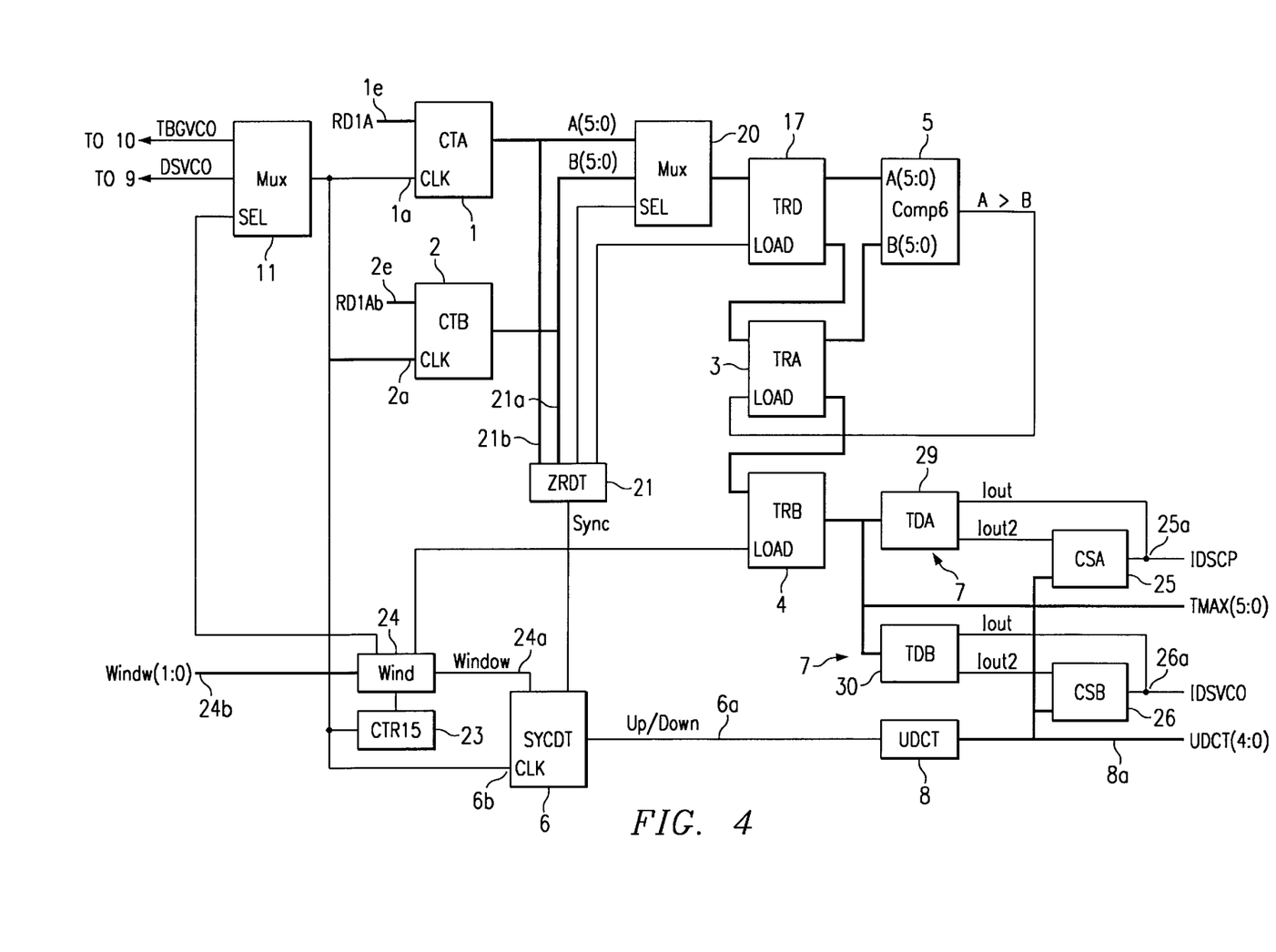
FIG. 4 is a block diagram of Sync7.

The outputs of CTA 1 and CTB 2 are fed to synchronization pattern detector ZRDT 21 in FIG. 4 to determine when the synchronization pattern has been established. For a DVD driver, ZRDT 21 searches for 13 clock cycles and outputs a synchronization signal when the pattern has been established. (For the CD driver, the ZRDT 21 searches for 11 clock cycles at one level and 11 at the other level.) Both counters, CTA 1 and CTB 2, are continuously updated and adjusted as input data change.

Detection of the synchronization pattern generates a reset signal at synchronization detector SYCDT 6 in FIG. 4. This initializes the 16-bit counter in counter CTR15 23 in FIG. 4 to zero. CTR15 23 is synchronized to the DSVCO 9 clock's frequency. Window detector Winddec10 24 in FIG. 4 traces the number of DSVCO 9 clock periods in CTR15 23 and generates a signal level called "window" 24a in FIG. 4 when the count is within the window accuracy set by Windw[1:0] bits 24b in FIG. 4. Windw[1:0] bits 24b consist of two bits used to select the desired accuracy (i.e., 1, 2, 3, and 10%) for the window to detect the synchronization pattern. Windw [1:0] bits 24b are controlled by a SYCR[2:1] bit (not shown). This signal 24b, as well as a synchronization signal from ZRDT 21, (not shown) is fed to SYCDT 6 for evaluation.

Figure 7:
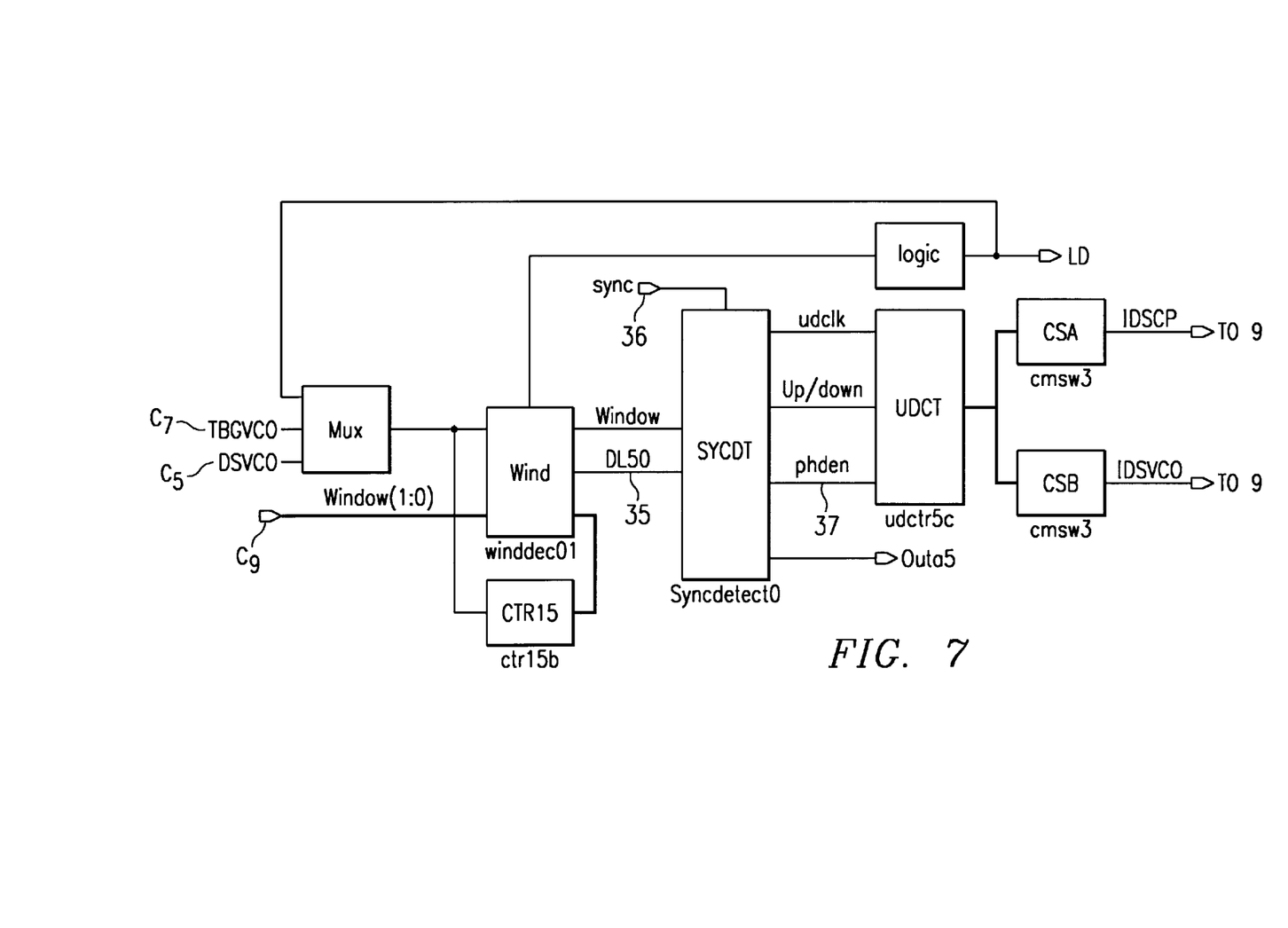
FIG. 7 is a description of the fine adjustment step.

SYCDT 6 determines when the synchronization pattern occurs, i.e., before or after the window. If the pattern occurs before the window, the DSVCO 9 clock's frequency is too low, and a signal is sent to increase it by altering the current 7a. Conversely, if the pattern occurs after the window, the frequency is too high, and a signal is sent to decrease it by altering the current 7a. Whenever the synchronization pattern occurs outside the window, the SYCDT 6 generates an up/down count signal 6a in FIG. 4. This signal together with a clock signal is forwarded to up/down counter UDCT 8 in FIG. 4 indicating the need to perform a shift in frequency. Otherwise, if the signal is within the window, a signal designated Phden 37 in FIG. 7 is generated. This is a phase detector enable signal UDCT [4:0] 8a in FIG. 4 that indicates the fine adjustment step is complete. If the signal does not fall within the window, the process is iterated until it does.

Figure 3:
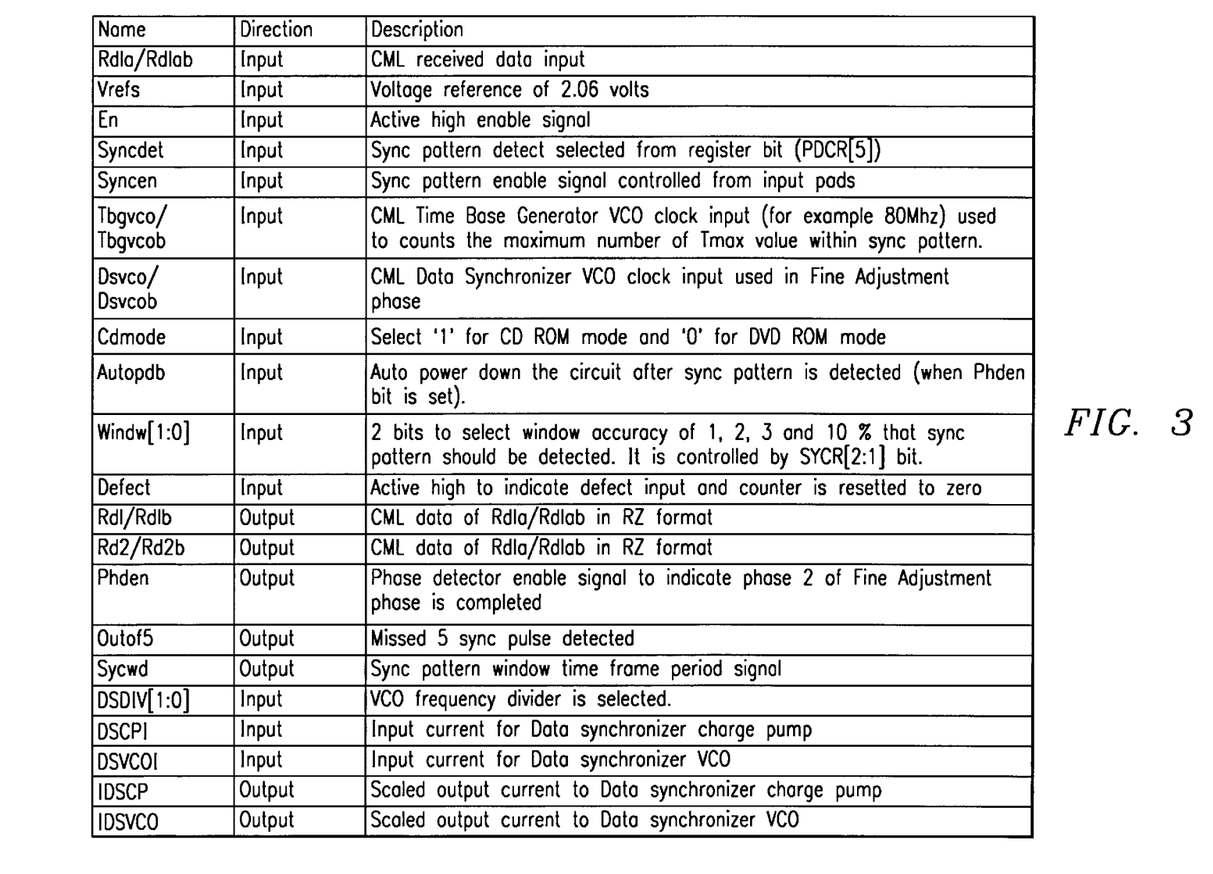
FIG. 3 is the input/output (IO) list for the Sync7.

UDCT 8 accepts the up/down count signal 6a and programs an internal 5-bit register (not shown) accordingly, via the enable signal 8a. The register is initially held at a center position of 5'b10000. If an up count is required, the register is incremented by 1, and if a down count is needed, decremented by 1. The range of adjustment for the fine adjustment step is approximately 5'b00000 (−16%) to 5'b11111 (+15%) with a step size of about 1%. If either "00" (i.e., all zeroes) or "1Fh" (i.e., all ones) is detected in UDCT 8, an overflow signal, designated udctrover2 Table in FIG. 3, is set to indicate an overflow condition. The current sources CSA 25 and CSB 26 accept the 5-bit data 8a from UDCT 8 and generate an electrical current, IOUt 25a and 26a in FIG. 4, based on the value of the 5-bit data 8a.

Frequency Detection Step A.

CTA 1 and CTB 2 are 6-bit counters that count "up" whenever there is a rising edge at their respective clock input, Clk 1a and 2a in FIG. 4. Setting the counter back to zero is done by three "reset sources": Rst 1, 2, and 3 1b, c, d and 2b, c, d in FIG. 5. Assuming both CTA 1 and CTB 2 are initialized and set to zero, when one of the respective input data signals Rd 1 a 1e and Rd 1 b 2e is held at one level, one of the clocks Clk 1a and 2a follows the TBGVCO's 10 clock while the other is disabled as the input data is inverted. For example, if Rd 1 a 1e is held at a high level, the CTA clock 1a is synchronized to the TBGVCO's 10 clock and the CTB clock 2a is disabled as input data Rd 1 a 1e is inverted. CTA 1 then starts to count the number of TBGVCO 10 clock periods. When Rd 1 a 1e is changed to a low level, then CTA 1 stops counting (without being reset) and CTB 2 starts counting.

Figure 5:
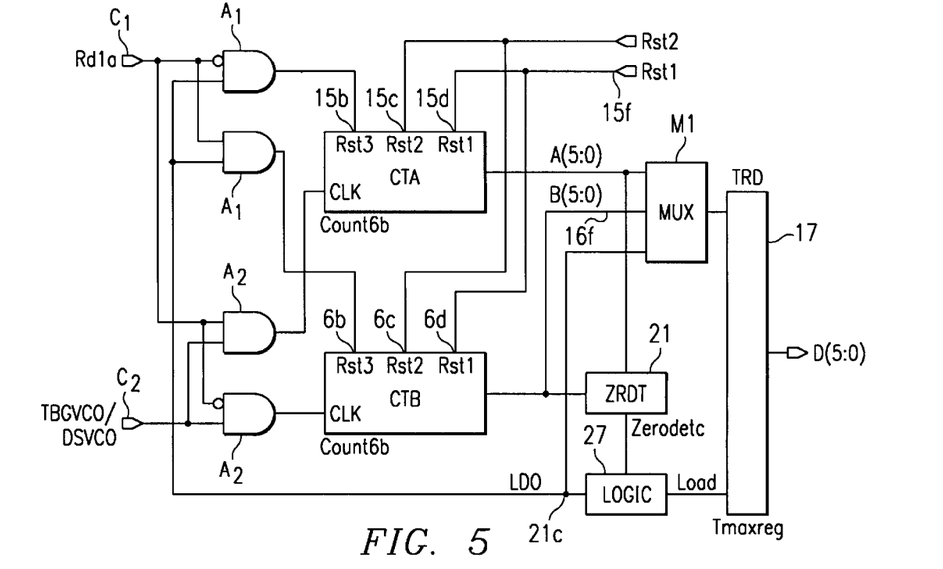
FIG. 5 is a description of wide capture frequency detection step A ($T_{max}$).

The detection of the synchronization pattern is done by ZRDT 21. The purpose of ZRDT 21 is to detect the synchronization pattern and to generate a reset signal 21a and 21b in FIG. 4 to reset the counter. For example, as the CTB 2 count reaches 2X, ZRDT 21 initiates a signal designated LDO 21c in FIG. 5. The LDO signal 21c is then passed through external logic 27 in FIG. 5 and two signals are generated. A "Load" signal 27a in FIG. 5 is generated to load the value in CTA 1 into TRD 17. The second signal LDO 21c is generated to reset CTA 1 to zero. CTB 2 is not reset since the Rst 1 signal 2b is held at the low level. At the same time MUX 28 in FIG. 4 is switched from A to B input as CTB 2 continues to count.

The process is iterated when input data Rd 1 a 1e changes level. TRD 17 continuously updates the count. TRD 17 compares incoming data with previously stored data to determine the highest count reached at any given level.

Frequency Detection Step B—Comparison.

The stored value from TRD 17 is compared with the value in TRA 18. To do this, TRA 18 is set to zero initially and comparison is done in comparator COMP6 20. COMP6 20 generates an output pulse whenever the A [5:0] input 1f in FIG. 5 is greater than the B[5:0] input 2f in FIG. 5. This pulse loads the data from TRD 17 to TRA 18. This is the highest count that the TBGVCO's 10 clock captured. It is viewed at the serial port register, $T_{max}$ R1.

Figure 6:
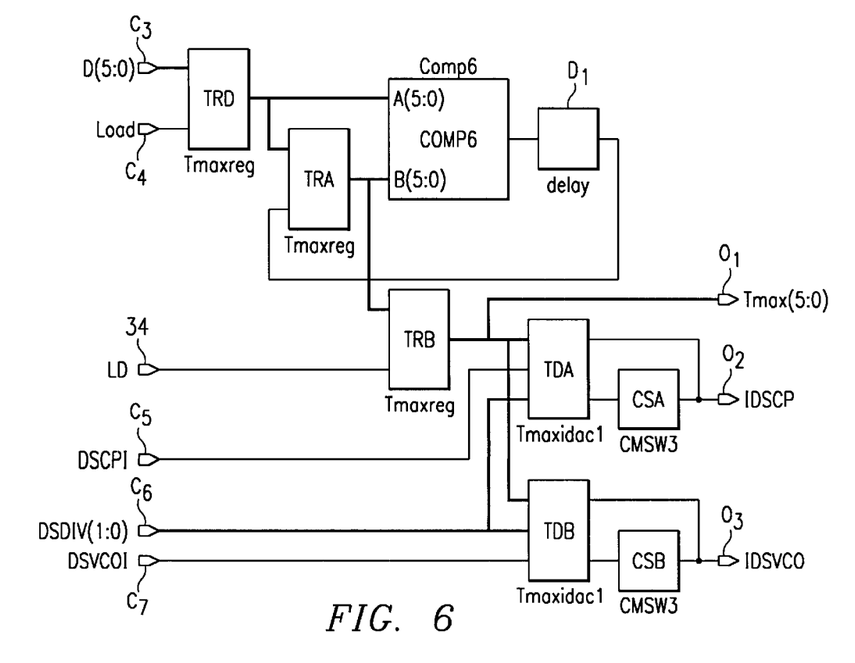
FIG. 6 is a description of wide capture frequency detection step B.

$T_{max}$ R1 values are delivered to TDA 29 in FIG. 4 and TDB 30 in FIG. 4 in order to set the appropriate current to be fed to DSVCO 9. TDA 29 and TDB 30 generate current based on the value of $T_{max}$ R1. In the $T_{max}$ R1 detection phase, the reference current, DSVCOI 31 in FIG. 6, is sent to TDB 30. TDB 30 outputs the same reference current, adding it to the current from current source CSB 26. At this time CSB 26 does not generate any current. The summed current, designated IDSVCO 32, is forwarded to DSVCO 9. At this time there is no change in the reference current, thus DSVCO 9 is running at its reference frequency.

When the count, now referencing the frequency from TBGVCO 10, reaches 40960 for DVD (24576 for CD), the DSVCOI 31 current is scaled as a function of the $T_{max}$ R1 value. TRB 4 acts as a "current mirror" thus enabling the effective resistance at the emitter to be controlled by the Tmax RI count. The effective resistance (not shown) and the DSDIV [1:0] input current 33 in FIG. 6 control the amount of "scaled current" to be sent to CSB 26. The frequency divider is now selected.

If the DSVCO frequency is not to be divided (as determined at SYCR [7:5]), the reference current adds to the current output, i.e., DSVCOI 31, of CSB 26. For example, if the $T_{max}$ R1 count is 14 and the ratio of the resistance in the current mirror(s) is 0.85, this current is proportional to 12T (i.e., 0.85·14T) of the total of 14T (for DVD). TDB 30 also initiates a 3T current to CSB 26 to fine adjust the frequency of DSVCO 9.

When the detection steps are completed, the clock frequency is changed from that of TBGVCO 10 to that of DSVCO 9. CTR15 23 counts the incoming clock periods. At the Winddec10 24 the accuracy of the window period is set by two bits, wind: [1:0]. For example, if wind: [1:0] is set to "00," then the window signal is shifted to the high level when the clock period count is within ±1% of a sector. (For DVD, a sector is 1488T and for CD, a sector is 588T.) Any value other than this means that the window signal stays at the low level.

The signal is then sent to SYCDT 6, combined with the synchronization signal from ZRDT 21, and the amount of error in DSVCO's 9 frequency is calculated. If the synchronization signal is set before the arrival of the window, SYCDT 6 issues an up signal together with a pulse designated udclk 6b in FIG. 7 to UDCT 8 in order to increment the counter. The 5-bit counter 8, in turn, controls the amount of current mirror output in CSA 25 and CSB 26. The counter 8 counts down when the synchronization signal occurs after the window arrives.

Initially, TDB 30 does not supply any current to CSB 26, and UDCT 8 is held at the intended center frequency, 5'b10000. In the fine adjustment step, the current at TDB 30 is scaled down to 12T and ¼ of the 12T current, i.e., a 3T current, is sent to CSB 26. CSB 26 then outputs a current that is ⅔ of the incoming 3T current. UDCT 8 adjusts the 3T current from 5'b00000 to 5'b11111, therefore the resolution becomes <1% [(⅟₃₂×4)/14×100]. This yields a maximum adjustment range from approximately −16% to +15% of input data frequency.

Windec10 24 generates an output signal when the count reaches 40960 for DVD (24576 for CD) when referenced to the TBGVCO's 10 clock. This signal is then passed through external logic 27 to load TRA 18 into TRB 4. This LD signal 34 in FIG. 6 switches the TBGVCO's 10 clock frequency to the DSVCO's 9 clock frequency. The LD signal 34 also generates a signal DL50 35 in FIG. 7 to SYCDT 6 to indicate when it has exceeded 50% of one frame of data (one frame of DVD is 1488T and one frame of CD is 588T).

If the synchronization signal 36 in FIG. 7 is detected during the window period, the Phden signal 37 is set. This marks the completion of the second part of frequency detection mode. The data synchronizer then enters the "zero phase" restart mode. SYCDT 6 will set signal Outof5 38 in FIG. 7 and the synchronization process will be stopped if either five DL50 35 signals are encountered or a synchronization pattern was missed.

Finally, if the powerdb bit (not shown) is set, the entire Sync7 circuit FIG. 4 will be powered off. The option to set "auto power bit" provides the capability of shutting power down to the entire Sync7 after the fine adjustment step has been completed.

EXAMPLE

Undivided.

After 24576 counts (CD) or 40960 counts (DVD), the following determination is performed:

| Assume: | $T_{max}$ | = 50 |
| | DIDIV | = 0 |
| | DSVCOI | = 100 μA (IREF) |
| | TBGVCO 10 frequency | = 80 MHz |
| Then: | Frequency required for the VCO: | |
| | 14/50 × 80 MHz | = 22.4MHz |
| Current needed to scale down should be: | | |
| IDSVCO = 14/50 × 100 μA | | = 28μA |
| Adding two current components to IDSVCO: | | |

-continued

```
Current from the resistance ratio at TRB 4:
12 T current =
(1.12k//2.42k//17.938k)/2.99k × 100 μA         = 23.98μA
3 T current to CSB 26:
3/12 × 23.98 μA                                 =   6.0μA
If the up/down counter (UDCT 8) is centered in window:
Current mirror ratio at CSB 26:
2/3 × 3 T current = 2/3 × 6.0 μA                =   4.0μA
Total current at IDSVCO = (3) + (1):
4.0 μA + 23.98 μA                               = 27.98μA
```

With 27.98 μA applied to the VCO, the frequency output will approximate the required 22.4 MHz.

For the case when DIDIV is divided, i.e., DIDIV=1, then the frequency of the VCO is required to be doubled. Doubling the total current accomplishes this in a straightforward fashion.

Figure 8:
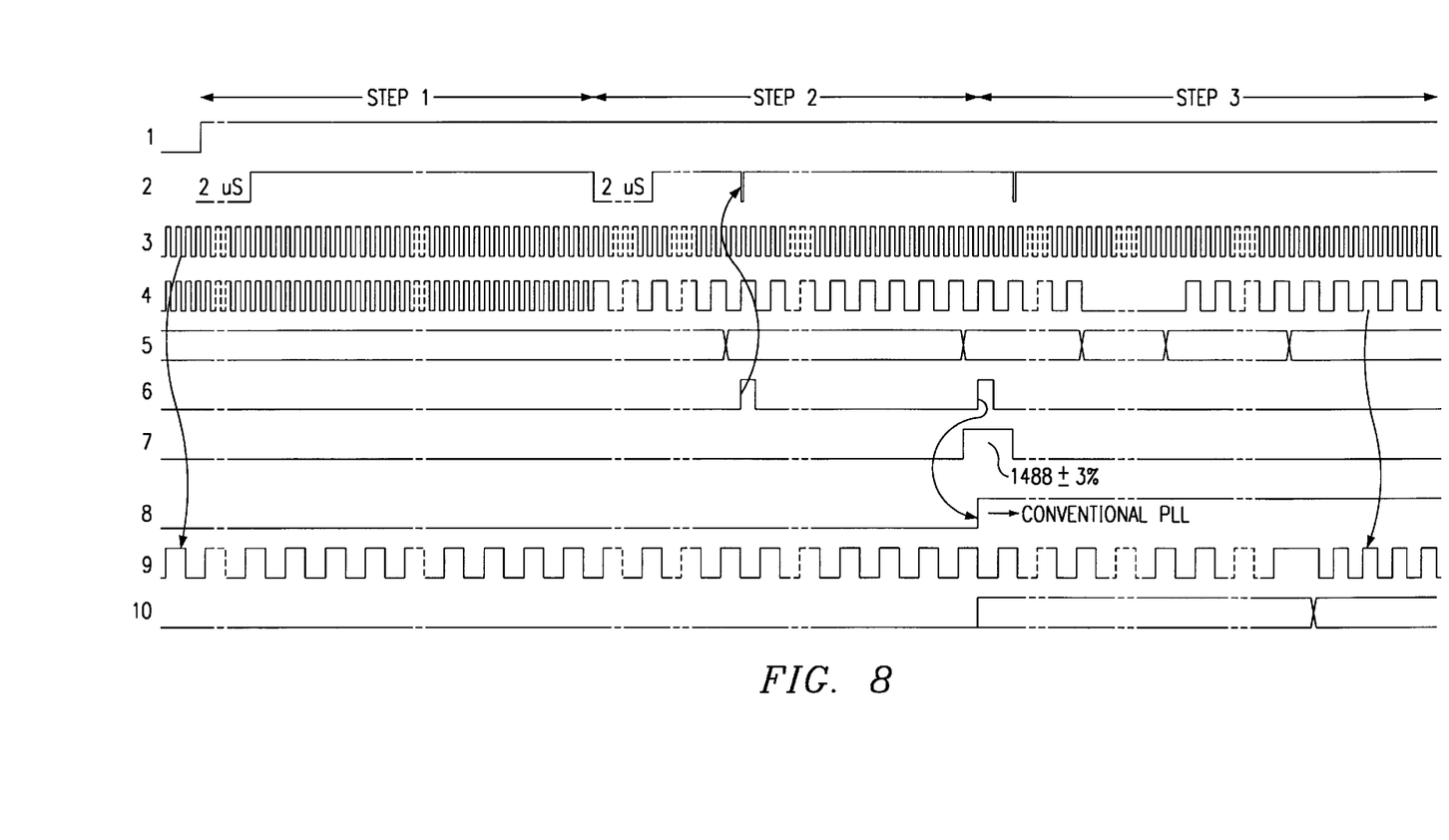
FIG. 8 is a synchronization pattern detection-timing chart for a DVD.

FIG. 8 provides a time line showing the two steps of the frequency detection mode after $T_{max}$ has been set and the single conventional step of phase detection. Line 1 represents the SYNCEN input to enable the process. Line 2 represents the setting of the 16-bit counter using the TBGVCO's clock 10 to count the first step of frequency detection and the DSVCO's clock 9 to count the second or fine adjustment step. TBGVCO is represented by Line 3 and the 6-bit counters CTA 1 and CTB 2 determine the Tmax value. Line 4 represents the DSVCO's 9 clock, allowed to free-run at the TBGVCO's 10 clock rate during the initial detection period and reset to the adjusted center frequency determined by $14/T_{max} \cdot$TBGVCO frequency. Line 5, RDO, represents the raw data input. Line 6 provides the synchronization pattern detection using the 6-bit counter. It changes the DSVCO 9 clock center frequency by the value in UDCT 8 if the synchronization signal is not in the window. Line 7 represents the synchronization window detection and setting based on a ±3% accuracy. Line 8 represents the start of the Phden signal 37 initiating the transition to the conventional phase detection mode. Line 9 represents the pulse train that will change the frequency from that of the TBGVCO to that of the DSVCO. It is calculated as TBGVCO frequency/4·DSVCO divider bit. Line 10 represents the synchronized data.

The foregoing describes the salient features of the present invention for achieving wide capture range, and should not be interpreted as limiting the application of, method of operation, or uses for the present invention to that specified in the foregoing. While the wide capture range apparatus and method has been shown with specific components and subsystems, and further described with regard to a specific order of implementation, it will be understood by those skilled in the art that various other changes in the selection of components and use with a different order of steps, or other details, may be changed without departing from the spirit and scope of the present invention.

We claim:

1. A system employing a drive having a speed synchronization capacity, the synchronization capacity comprising:

first and second signal sources generating a first and a second signal, respectively;

a first circuit, for receiving said first and second signals in order to establish a first estimated synchronization frequency near that of an operating speed of the drive and for generating a third signal containing said first estimated frequency;

a second circuit, for receiving said third signal in order to refine said first estimated frequency and for generating a fourth signal containing said refined estimated frequency;

a third circuit, for receiving said fourth signal in order to establish a desired frequency of operation with a predetermined variance, and to generate a fifth signal containing said desired frequency; and a fourth circuit, for receiving said fifth signal in order to detect and lock said desired frequency as a synchronization frequency.

2. The system of claim 1 wherein said signal sources are first and second voltage controlled oscillators (VCOs).

3. The system of claim 2 wherein said first VCO is a data synchronization VCO (DSVCO) and said second VCO is a time base generator VCO (TBGVCO).

4. The system of claim 1 wherein said fourth circuit comprises a Phase-Locked Loop (PLL).

5. The system of claim 1 wherein a current divider is used to attain said estimates.

6. The system of claim 1 wherein said first circuit comprises first and second gates, an inverter, first and second n-bit counters, a synchronization pattern detector, a first multiplexer, and first and second registers, functionally interconnected as said first circuit, wherein said first circuit is functionally connected to an external logic device so as to determine a first synchronization frequency estimate.

7. The system of claim 6 wherein said n-bit counters are 6-bit current mode logic (CML) counters.

8. The system of claim 1 wherein said third circuit comprises a second multiplexer, an adjustable window circuit, an m-bit counter, a synchronization determination apparatus, a p-bit up/down counter, functionally interconnected as said third circuit, for determining a fine adjustment synchronization frequency, wherein, said third circuit receives inputs from said first and second current sources, an adjustable external input element, and said second circuit.

9. The system of claim 8 wherein said m-bit counters are 16-bit counters and said p-bit counters are 5-bit counters.

10. A method for synchronizing the operating speed of a system, comprising:

providing reference and timing signals;

detecting and capturing first, second and third estimates of a frequency near that of an operating speed of the drive, said third estimate having a desired center value and variance;

identifying a desired synchronization pattern within said third estimate and generating a synchronization indication; and phase locking said synchronization indication.

11. The method of claim 10, wherein said reference and timing signals are provided by a TBGVCO and a DSVCO.

12. The method of claim 11, further comprising generating a proportional frequency by dividing a current from said TBGVCO to said DSVCO.

13. The method of claim 11, further comprising calculating said DSVCO's center frequency from the relationship:

$$F = (x/N) \, F \, (TBGVCO)$$

Where:
| | | |
|---|---|---|
| x | = | 11 for CD drives. |
| x | = | 14 for DVD drives. |
| N | = | maximum count stored in said $T_{max}$ register. |
| F(TBGVCO) | = | the center frequency of said TBGVCO. |

14. The method of claim 11, further comprising:

a) restarting said DSVCO by entering a "zero phase" restart mode;

b) setting signal Outof5 if one of the following occurs:
   i) encountering five DL50 signals;
   ii) missing said synchronization pattern; and
c) powering off said synchronization circuit if a powerdb bit is set.

15. The method of claim 10, wherein said phase locking is accomplished using a PLL.

16. The method of claim 10, wherein said estimates are derived by using a current divider to alter current.

17. The method of claim 10, further comprising using a Phase-Locked Loop (PLL) to accomplish phase detection and locking.

18. The method of claim 10, wherein frequency is shifted by forwarding an up/down count signal, together with said reference signal, to an up/down counter for implementing a frequency shift.

19. A disk drive having a speed synchronization capacity, the synchronization capacity comprising:

first and second signal sources generating a first and a second signal, respectively;
   a first circuit, for receiving said first and second signals in order to establish a first estimated synchronization frequency near that of an operating speed of the drive and for generating a third signal containing said first estimated frequency;
   a second circuit, for receiving said third signal in order to refine said first estimated frequency and for generating a fourth signal containing said refined estimated frequency;
   a third circuit, for receiving said fourth signal in order to establish a desired frequency of operation with a predetermined variance, and to generate a fifth signal containing said desired frequency; and
   a fourth circuit, for receiving said fifth signal in order to detect and lock said desired frequency as a synchronization frequency.

20. The drive of claim 19 wherein said signal sources are first and second voltage controlled oscillators (VCOs).

21. The drive of claim 20 wherein said first VCO is a data synchronization VCO (DSVCO) and said second VCO is a time base generator VCO (TBGVCO).

22. The drive of claim 19 wherein said fourth circuit comprises a Phase-Locked Loop (PLL).

23. The drive of claim 19 wherein a current divider is used to attain said estimates.

24. A method for synchronizing the operating speed of a disk drive, comprising:

providing reference and timing signals;
   detecting and capturing first, second and third estimates of a frequency near that of an operating speed of the drive, said third estimate having a desired center value and variance;
   identifying a desired synchronization pattern within said third estimate and generating a synchronization indication; and
   phase locking said synchronization indication.

25. The method of claim 24, wherein said reference and timing signals are provided by a TBGVCO and a DSVCO.

26. The method of claim 25, further comprising generating a proportional frequency by dividing a current from said TBGVCO to said DSVCO.

27. The method of claim 25, further comprising calculating said DSVCO's center frequency from the relationship:

$$F = (x/N)\ F\ (TBGVCO)$$

Where:
  $x$ = 11 for CD drives.
  $x$ = 14 for DVD drives.
  $N$ = the maximum count stored in said $T_{max}$ register.

F(TBGVCO) = the center frequency of said TBGVCO.

28. The method of claim 25, further comprising:
   restarting said DSVCO by entering a "zero phase" restart mode;
   setting signal Outof5 if one of the following occurs:
      encountering five DL50 signals;
      missing said synchronization pattern; and
   powering off said synchronization generation capability if a powerdb bit is set.

29. The method of claim 24, wherein said phase locking is accomplished using a PLL.

30. The method of claim 24, wherein said estimates are derived by using a current divider to alter current.

31. The method of claim 24, further comprising using a Phase-Locked Loop (PLL) to accomplish phase detection and locking.

32. The method of claim 24, wherein frequency is shifted by forwarding an up/down count signal, together with said reference signal, to an up/down counter for implementing a frequency shift.

* * * * *

UNITED STATES PATENT AND TRADEMARK OFFICE
CERTIFICATE OF CORRECTION

PATENT NO. : 6,269,058 B1
DATED : July 31, 2001
INVENTOR(S) : Koyu Yamanoi, Hiroshi Kobayashi and Futoshi Fujinara It is certified that error appears in the above-identified patent and that said Letters Patent is hereby corrected as shown below:

Title page,
Item [75], Inventor, change "Fujinara" to -- Fujiwara --.

Signed and Sealed this

Eighteenth Day of October, 2005

JON W. DUDAS
*Director of the United States Patent and Trademark Office*